United States Patent [19]
Yamada

[11] Patent Number: 6,114,093
[45] Date of Patent: Sep. 5, 2000

[54] METHOD OF DRAWING A PATTERN BY DIRECT WRITING WITH CHARGED PARTICLE BEAM UTILIZING RESIST CONTAINING METAL POWDER

[75] Inventor: Yasuhisa Yamada, Tokyo, Japan

[73] Assignee: NEC Corporation, Tokyo, Japan

[21] Appl. No.: 09/335,343

[22] Filed: Jun. 17, 1999

[30] Foreign Application Priority Data

Jun. 17, 1998 [JP] Japan .................................. 10-169704

[51] Int. Cl.⁷ ...................................................... G03F 7/20
[52] U.S. Cl. ............................................ 430/296; 430/942
[58] Field of Search ............................... 430/30, 296, 942

[56] References Cited

U.S. PATENT DOCUMENTS 4,612,275  9/1986  Gregor ..................................... 430/296
5,215,867  6/1993  Stillwagon et al. ..................... 430/323

FOREIGN PATENT DOCUMENTS

| 59-87454 | 5/1984 | Japan . |
| 60-41223 | 3/1985 | Japan . |
| 63-216042 | 9/1988 | Japan . |
| 3-10358 | 1/1990 | Japan . |
| 2-87616 | 3/1990 | Japan . |
| 4-29148 | 1/1992 | Japan . |
| 8-328255 | 12/1996 | Japan . |

*Primary Examiner*—Christopher G. Young
*Attorney, Agent, or Firm*—Scully, Scott, Murphy & Presser

[57] ABSTRACT

A pattern drawing method by directly writing a pattern with a charged particle electron beam, in which a resist containing metal powders is applied on a substrate having a substrate pattern formed thereon, so to form a resist film, and a desired pattern is written by exposing the resist film with a charged particle electron beam.

10 Claims, 3 Drawing Sheets

METHOD OF DRAWING A PATTERN BY DIRECT WRITING WITH CHARGED PARTICLE BEAM UTILIZING RESIST CONTAINING METAL POWDER

BACKGROUNDS OF THE INVENTION

1. Field of the Invention

The present invention relates to a method of drawing a pattern by direct writing with a charged particle beam using a resist, in electron beam direct writing.

2. Description of the Related Art

In a manufacturing method of a semiconductor apparatus, the density of the apparatus is generally becoming higher and higher. Especially, in a lithography for exposing a fine pattern on a semiconductor wafer, the design rule is becoming finer. An X-ray lithography using an X-ray, or a charged particle beam lithography using a charged particle beam, instead of an optical lithography using a ultraviolet light, is being developed as the next generation lithography.

In the charged particle beam lithography, a substrate pattern 30 is formed by patterning a substrate layer formed on a substrate 20 as illustrated in FIG. 6. Here, the pre-process of patterning a substrate layer is completed.

As illustrated in FIG. 7, a resist film 50 is formed by applying a resist on the substrate 20 having the substrate pattern 30 formed. An electron beam (charged particle beam) 40 is applied to this resist film 50 and a writing pattern is formed by its development.

The resist film 50 consists of a base resin, photooxidation agent, cross linking agent, dissolution inhibitor, and the like, and oxide is generated by irradiation of the electron beam (charged particle beam) 40. The generated oxide causes the elimination reaction of protecting group of the base resin, or the ligand bridged reaction of the resin, thereby changing the solubility characteristic for the developer. This produces difference in the solubility for the developer between an irradiated portion and a non-irradiated portion, thereby enabling patterning.

As illustrated in FIG. 8, in a charged particle beam exposure, exposure amount is adjusted depending on the density of a writing pattern, in order to correct the proximity effect in the substrate pattern 30 of a layer to be written. Alternatively, auxiliary exposure by a defocus beam makes constant, the accumulation energy within the resist film 50 concerned with the pattern writing. In these ways, the proximity effect depending on the pattern of a layer to be written can be corrected.

The reference numeral 90 indicated by the broken line in FIG. 8 is a design data pattern, and the reference numeral 100 indicated by the solid line is an actual exposure pattern.

The conventional pattern drawing method is able to correct the proximity effect concerned with the writing pattern. However, since the device is formed by overlapping a plurality of layers including an element separation layer, a conductivity contact layer, a wiring layer, and the like, it is subjected to the effect of the pattern on the substrate pattern 30 which has been formed in the pre-process, in addition to the proximity effect generated in a layer to be written. This is because the scattering degree of electron beam depends on the existence of the substrate pattern 30, thereby to change the writing density, in the electron beam exposure.

Therefore, the conventional method has such a problem that the effect of the substrate pattern 30 deteriorates the drawing accuracy of a writing pattern. For example, when there exists a wiring pattern of a heavy metal as the substrate of a writing pattern, backscattering of an electron beam in an area having the substrate of the heavy metal (reflected electron 60 rebounded from the area having the substrate pattern 30 as illustrated in FIG. 7) is greater than that of a reflected electron 70 in an area having no substrate. This means that writing in the area having the substrate pattern is actually performed at higher exposure amount. Therefore, it has such a problem that the actual pattern of an actual exposure pattern 100 in the area having the substrate becomes greater than the design data pattern 90 obtained in the stage of design.

SUMMARY OF THE INVENTION

An object of the present invention is to provide a pattern drawing method capable of correcting the proximity effect depending on the existence of a substrate pattern and improving the accuracy of a writing pattern.

According to one aspect of the invention, a pattern drawing method by direct writing with an charged particle electron beam, comprising a step of applying a resist containing metal powders on a substrate having a substrate pattern formed thereon, so to form a resist film, and a step of drawing a desired pattern by exposing the resist film with the charged particle electron beam.

In the preferred construction, a substrate layer is formed on the substrate and the substrate layer is patterned, to be defined as a substrate pattern, and the resist containing the metal powders is applied on the substrate and the substrate pattern, so to form a resist film.

In another preferred construction, the density of the metal powder varies according to the depth of the resist film.

In another preferred construction, the resist film is formed so that the density of the metal powder should become higher according as the depth of the resist film becomes greater.

In another preferred construction, the scattering effect of the electron beam from the metal powders in the resist film enhances the exposure strength in a thick portion of the resist film more than that in the other portion, thereby correcting the proximity effect generated from the substrate pattern, so to obtain a constant drawing density.

In another preferred construction, the metal powder is a gold particle. Also, the metal powder is a transition metal fine grain of atomic weight 45 or more and grain diameter 1 $\mu$m or less.

In another preferred construction, the metal powder is one of transition metal fine grains; Ti, W, and Au having the grain diameter 1 $\mu$m or less and the atomic weight 45 or more.

In another preferred construction, the resist film is formed so that the density of the metal powder should become higher according as the depth of the resist film becomes greater, and the metal powder is a gold particle.

In another preferred construction, the resist film is formed so that the density of the metal powder should become higher according as the depth of the resist film becomes greater, and the metal powder is a transition metal fine grain of atomic weight 45 or more and grain diameter 1 $\mu$m or less.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

FIGS. 1 to 5 respectively show the embodiment according to the pattern drawing method of the present invention.

The embodiment of the pattern drawing method here uses a pattern drawing method by directly writing a pattern with a charged particle electron beam.

Figure 1:
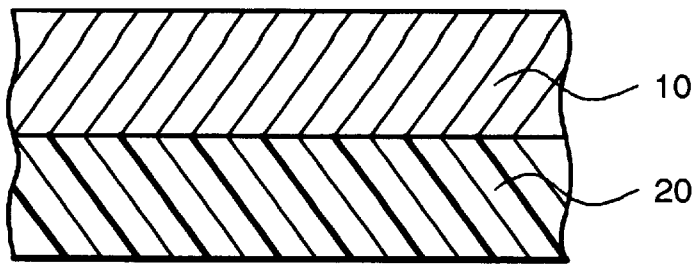
FIG. 1 is a view for use in describing the fabrication process of a substrate layer in the pre-process according to the pattern drawing method of the present invention.
Figure 2:
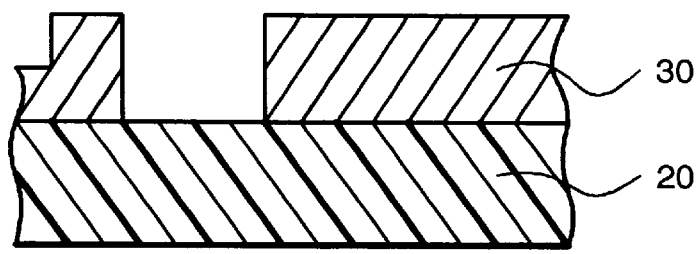
FIG. 2 is a view for use in describing the fabrication process of a substrate pattern in the pre-process, showing an embodiment according to the pattern drawing method of the present invention.
Figure 6:
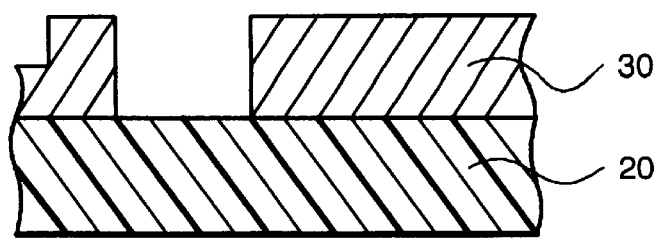
FIG. 6 is a view for use in describing the fabrication process of a substrate pattern in the pre-process according to the conventional pattern drawing method.
Figure 7:
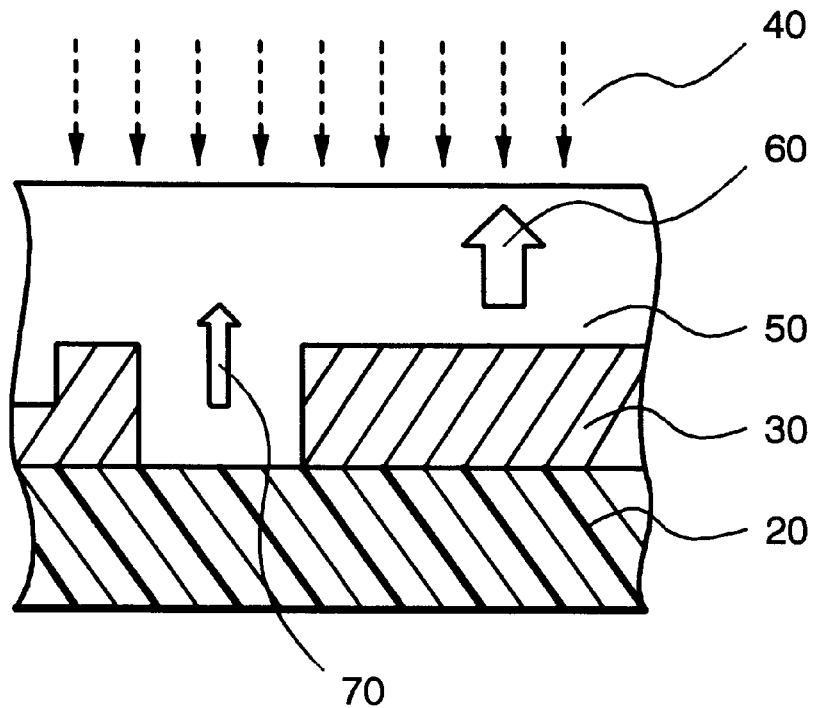
FIG. 7 is a view for use in describing the process of forming a resist film and directly writing a pattern with an electron beam, after the fabrication process of a substrate layer is completed as shown in FIG. 6.

With reference to FIG. 1, in the pattern drawing method of the embodiment, a metal such as tungsten (W) is applied on a substrate 20, hence to form a substrate layer 10, as illustrated in FIG. 1. As illustrated in FIG. 2, a substrate pattern 30 is formed by patterning the substrate layer 10. Here, the pre-process of forming the substrate pattern 30 by patterning the substrate layer 10 is completed. The same method as the conventional example described in FIG. 6 is used in this pre-process.

Figure 8:
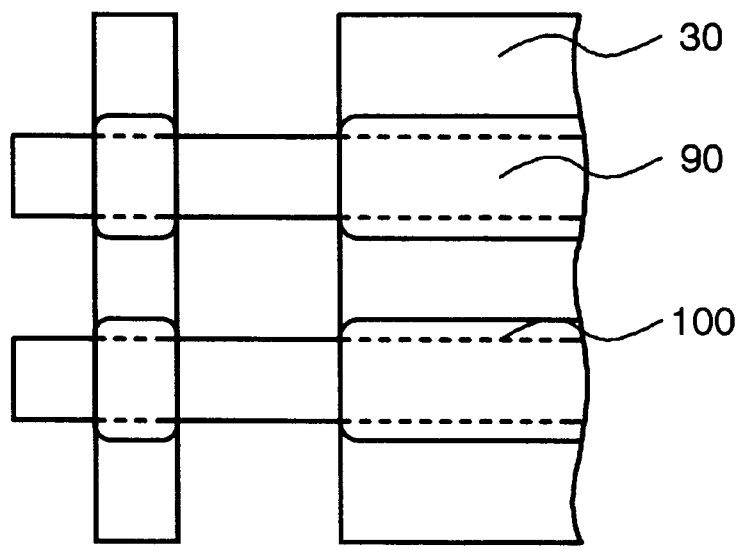
FIG. 8 is a plan view showing a writing pattern drawn according to the conventional pattern drawing method.

The substrate pattern 30 of tungsten formed in the preprocess is written on the substrate 20, for example, formed on a silicon substrate, by using the electron beam direct writing, as shown by the design data pattern 90 in FIG. 8. The substrate pattern 30 formed in the pre-process is of a schematic illustration showing the difference in the level, and as apparent from FIG. 2, the height of the substrate pattern 30 on the substrate 20 is various.

Figure 3:
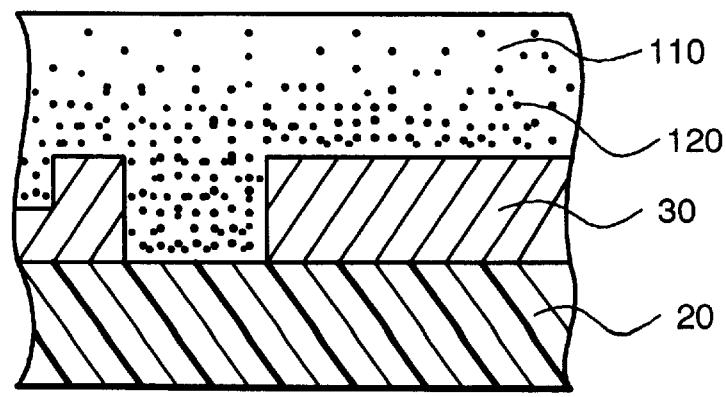
FIG. 3 is a view for use in describing the process of forming a resist film, after the pre-process of FIG. 2.

In the pattern drawing method of the present invention, a desired pattern is to be written on a resist including metal powders applied on the substrate 20. As illustrated in FIG. 3, a resist including about 10% of gold particles 120 that are metal powders as an addition agent of grain diameter 1 $\mu$m or less is applied on the substrate 20 and the substrate pattern 30, thereby forming a resist film 110 by use of a spin coater or the like.

The resist film 110 is obtained by applying a resist with a spin coater or the like, leaving it for a few minutes, and pre-baking it. At this time, the resist film 110 in a higher level area (at a large height) on the substrate 20 becomes thin, and the resist film 110 in a flat surface area on the substrate 20 becomes thick.

As mentioned above, the resist film 110 contains the gold particles 120 as the addition agent. Since the gold particles 120 contained in the resist film 110 are heavier compared with the resist, many particles sediment at a lower portion.

Figure 4:
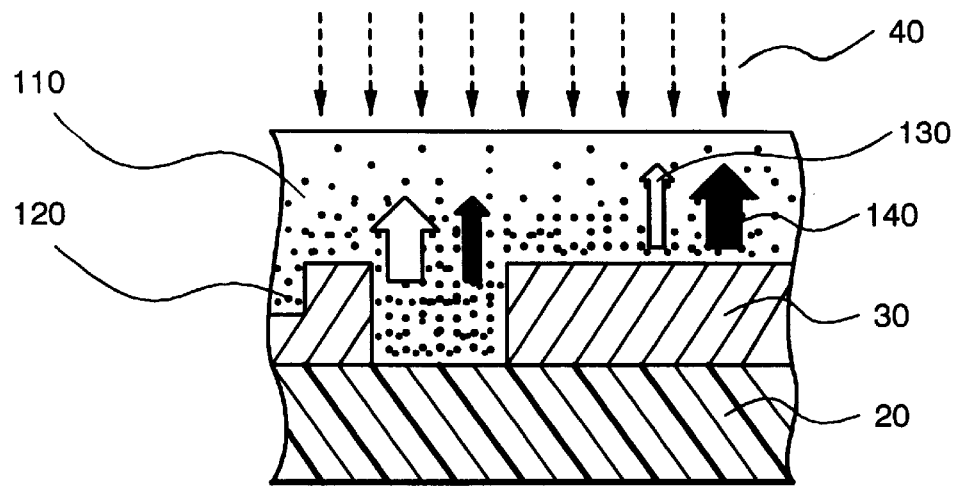
FIG. 4 is a view for use in describing the state of directly writing a pattern with an electron beam, after the state shown in FIG. 3.

As illustrated in FIG. 4, a desired pattern is exposed with an electron beam (charged particle beam) 40, on the resist film 110 containing the gold particles 120 applied on the substrate 20. In the pattern drawing with the electron beam 40, there is scattering from the substrate pattern 30, and due to the proximity effect from the substrate pattern 30 by the reflected electron 140, the writing strength in the area having the substrate pattern 30 becomes greater than that in the area having no substrate pattern 30.

Further, as for the reflected electron 130 from the gold particle 120, the writing strength in the area having no substrate pattern 30 becomes greater than that in the area having the substrate pattern 30.

In the electron beam direct writing, a resist containing the gold particles 120 is used, this resist is applied, and the resist film 110 having various density (gradient density) of the gold particles 120, that are fine particles, according to the depth of the resist is obtained. In this resist film 110, according as the depth of the resist becomes deeper, the density of the additional material becomes higher, thereby increasing the proximity effect.

The thickness of the resist film 110 varies depending on the height level of the substrate pattern 30; however, the electron beam 40 applied on the resist film 110 is scattered as the reflected electron 130 from the gold particle 120 existing within the resist film 110, and hence the backscattering is greater compared with the ordinal resist of only high polymer. Although, the thickness of the resist film 110 depends on the existence of the substrate pattern 30, the total amount of the gold particles 130 contained in the thick portion of the resist film 110 is more than that in the thin portion thereof, and hence the scattering effect of the electron beam 40 is greater as much.

Figure 5:
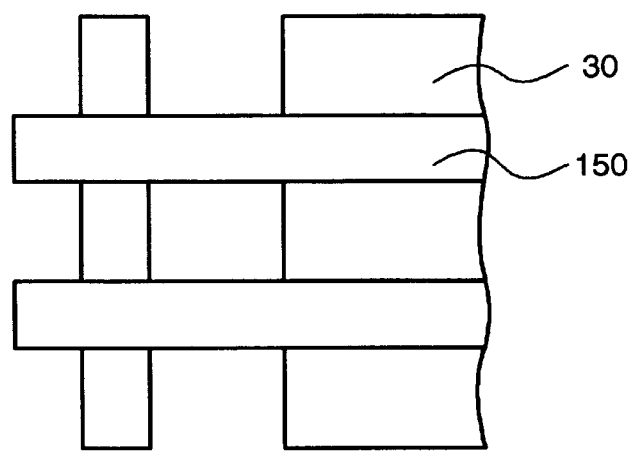
FIG. 5 is a plan view showing a writing pattern drawn according to the embodiment of the pattern drawing method in the present invention.

As illustrated in FIG. 4, the exposure strength in the thick portion of the resist film 110 (the area having no substrate pattern 30) is higher than that in the other portion. In these ways, a constant writing strength can be obtained, regardless of the presence of the substrate pattern 30, by correcting the proximity effect originally generated from the substrate pattern 30. The reference numeral 150 in FIG. 5 shows an actual drawing pattern after correction of the effect caused by the substrate pattern 30.

In the embodiment of the pattern drawing method according to the present invention, the description has been made in the case of drawing a desired pattern on a resist containing metal powders such as gold particles 120 applied on the substrate 20. This embodiment, however, is not restricted to the gold particle 120 as the metal powder, but the same effect as mentioned above can be obtained also by adopting a transition metal fine grain of atomic weight 45 or more such as Ti, W, Au, or the like whose grain diameter is 1 $\mu$m or less.

According to the present invention, the thickness of a resist film varies according to the level of the substrate pattern; namely, the resist film becomes thick in the area having no substrate pattern, and the resist film becomes thin in the area having the substrate pattern. According as the resist film becomes thicker, the total amount of the addition agent contained in this portion becomes more; accordingly, an irradiated electron beam is more easily scattered. That is, backscattering becomes greater. This can decrease an unfavorable effect depending on the presence of a substrate pattern and keep the proximity effect constant and uniform regardless of the presence of a substrate pattern.

Therefore, a resist itself is provided with the function of the proximity effect correction, regardless of the presence of the substrate pattern, so the proximity effect depending on the presence of the substrate pattern can be calibrated, thereby improving the accuracy of a drawing pattern.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A pattern drawing method by direct writing with a charged particle electron beam, comprising:
    a step of applying a resist containing metal powders on a substrate having a substrate pattern formed thereon, so to form a resist film; and
    a step of drawing a desired pattern by exposing the resist film with the charged particle electron beam.

2. A pattern drawing method as set forth in claim 1, wherein
    a substrate layer is formed on the substrate and the substrate layer is patterned, to be defined as a substrate pattern, and
    the resist containing the metal powders is applied on the substrate and the substrate pattern, so to form a resist film.

3. A pattern drawing method as set forth in claim 1, wherein
    the density of the metal powder varies according to the depth of the resist film.

4. A pattern drawing method as set forth in claim 1, wherein
    the resist film is formed so that the density of the metal powder should become higher according as the depth of the resist film becomes greater.

5. A pattern drawing method as set forth in claim 1, wherein
    the scattering effect of the electron beam from the metal powders in the resist film enhances the exposure strength in a thick portion of the resist film more than that in the other portion, thereby correcting the proximity effect generated from the substrate pattern, so to obtain a constant drawing density.

6. A pattern drawing method as set forth in claim 1, wherein
    the metal powder is a gold particle.

7. A pattern drawing method as set forth in claim 1, wherein
    the metal powder is a transition metal fine grain of atomic weight 45 or more and grain diameter 1 $\mu$m or less.

8. A pattern drawing method as set forth in claim 1, wherein
    the metal powder is one of transition metal fine grains; Ti, W, and Au having the grain diameter 1 $\mu$m or less and the atomic weight 45 or more.

9. A pattern drawing method as set forth in claim 1, wherein
    the resist film is formed so that the density of the metal powder should become higher according as the depth of the resist film becomes greater, and
    the metal powder is a gold particle.

10. A pattern drawing method as set forth in claim 1, wherein
    the resist film is formed so that the density of the metal powder should become higher according as the depth of the resist film becomes greater, and
    the metal powder is a transition metal fine grain of atomic weight 45 or more and grain diameter 1 $\mu$m or less.

* * * * *